(12) United States Patent
Shin

(10) Patent No.: US 6,368,405 B1
(45) Date of Patent: Apr. 9, 2002

(54) APPARATUS FOR GROWING SINGLE CRYSTAL SILICON AND METHOD FOR FORMING SINGLE CRYSTAL SILICON LAYER USING THE SAME

(75) Inventor: Seung Woo Shin, Kyoungki-do (KR)

(73) Assignee: Hyundai Electronics Industries Co., Ltd., Ich'on (KR)

( * ) Notice: Subject to any disclaimer, the term of this patent is extended or adjusted under 35 U.S.C. 154(b) by 0 days.

(21) Appl. No.: 09/459,781

(22) Filed: Dec. 13, 1999

(30) Foreign Application Priority Data

Dec. 24, 1998 (KR) .............................. 98-57976

(51) Int. Cl.⁷ .............................................. C30B 25/10
(52) U.S. Cl. ..................... 117/93; 117/94; 117/97; 117/101; 117/200; 117/201; 117/923
(58) Field of Search .................. 117/200, 201, 117/94, 93, 97, 101, 923

(56) References Cited

U.S. PATENT DOCUMENTS

| | | | | |
|---|---|---|---|---|
| 5,112,439 A | * | 5/1992 | Reisman et al. | 156/656 |
| 5,242,530 A | | 9/1993 | Batey et al. | 156/613 |
| 5,304,834 A | * | 4/1994 | Lynch | 257/374 |
| 5,422,299 A | * | 6/1995 | Neudeck et al. | 437/63 |
| 5,589,421 A | * | 12/1996 | Miyashita et al. | 437/225 |
| 5,744,386 A | * | 4/1998 | Kenny | 438/245 |
| 5,990,530 A | * | 11/1999 | Suzuki | 257/408 |

FOREIGN PATENT DOCUMENTS

| | | | | |
|---|---|---|---|---|
| JP | 58056320 | 4/1983 | | H01L/21/205 |
| JP | 58056321 | 4/1983 | | H01L/21/205 |
| JP | 01149466 | 6/1989 | | H01L/29/72 |
| JP | 09063964 | 3/1997 | | H01L/21/205 |
| JP | 09186319 | 7/1997 | | H01L/29/78 |
| JP | 09190979 | 7/1997 | | H01L/21/205 |
| JP | 10032329 | 2/1998 | | H01L/29/78 |

* cited by examiner

Primary Examiner—Robert Kunemund
(74) Attorney, Agent, or Firm—Finnegan, Henderson, Farabow, Garrett & Dunner, L.L.P.

(57) ABSTRACT

A single crystal silicon growth apparatus, comprising: a chamber where a silicon substrate is to be inserted; a heat source for rising the temperature in an interior of the chamber; a cooling line for rapidly dropping the temperature in the interior of the chamber; a gas sprayer for providing a source gas and a purge gas inside the chamber; a gas inflow line connected to the gas sprayer for inflowing the source gas and the purge gas into the gas sprayer; and a gas exhausting line for maintaining the interior of the chamber with a vacuum.

19 Claims, 8 Drawing Sheets

APPARATUS FOR GROWING SINGLE CRYSTAL SILICON AND METHOD FOR FORMING SINGLE CRYSTAL SILICON LAYER USING THE SAME

BACKGROUND OF THE INVENTION

This invention relates to a method for forming a single crystal silicon layer, and more particularly to an apparatus for growing a single crystal silicon at a desired thickness in a selected portion, and a method for forming a single crystal silicon layer using the same.

As is well known, a dynamic random access memory (DRAM) device includes a cell array portion where a plurality of DRAM cells where each consists of a transistor and a capacitor, are arranged in a matrix form and a peripheral circuit portion which drives the cell array portion to write data in the DRAM cells or to read the stored data from the DRAM cells. The DRAM cell includes a bit line which is electrically connected to the peripheral circuit portion and in accordance with the signal from the peripheral circuit portion, write/read the data in/from the capacitor through the bit line.

FIG. 1 is a sectional view of a typical DRAM cell. An isolation film 2 is formed in a surface of a silicon substrate 1 to define an active region and a transistor 10 including a gate oxide 3, a gate 4 and source and drain regions 6a and 6b is formed in the active region of the substrate 1 defined by the isolation film 2. The reference numeral 5 in drawing designates spacers used in forming the source and drain regions 6a and 6b of a lightly doped drain type.

The first intermediate insulating layer 11 is formed to cover the transistor 10 and then etched to form a first contact hole 12 which exposes the drain region 6b of the transistor 10. A plug 13 for bit line is formed within the first contact hole 12 and a bit line 14 is formed over the first intermediate insulating layer to be contacted with the drain region 6b through the bit line plug 13.

A second intermediate insulating layer 15 is formed over the first intermediate insulating layer 11 including the bit line 14 and then the first and second intermediate insulating layers 11 and 15 are etched to form a second contact hole 16 which exposes the source region 6a. A plug 17 for storage node is formed within the second contact hole 16 and a capacitor 20 is formed over the second intermediate insulating layer 15 to be contacted the source region 6a through the storage node plug 17. The capacitor 20 includes a storage node 18a contacted with the source region 6a through the storage node plug 17, a dielectric film 18b formed over the storage node 18a and a plate node 18c formed over the dielectric film 18b.

A polysilicon layer doped with conductive impurities, which is to be fabricated with ease, has been used as a material for the bit line and the plug for connecting the drain region of the transistor. However, the doped polysilicon has a low mobility of carrier due to an interface effect between grains. When the doped polysilicon uses for bit line plug, it acts on the factor for reducing the input/output speed of data.

Furthermore, the doped polysilicon that is used for the plug for storage node for electrically connecting the storage node of the capacitor where data are stored to the source region of the transistor, acts on the factor of speed reduction as the plug for the bit line. When the doped polysilicon is used for the plug for storage node, because the charges for data are spontaneously reduced, the desired capacitance is not obtained.

The technology using single crystal silicon for bit line plug and storage node plug instead of polysilicon has been proposed. Because the single crystal silicon has grains arranged in one direction, it can improve the data input/output speed as compared with the polysilicon having grains arranged in multiple directions.

The single crystal silicon is formed by a conventional selective epitaxial growth method. The selective epitaxial growth method utilizes the principle that the growth time of the silicon nucleus is different in accordance with the material of the underlying film. It makes silicon atoms to selectively adsorb over the underlying film made of single crystal silicon and grows the single crystal silicon having the same grain direction as the underlying film.

FIG. 2 is a sectional view for illustrating a method for forming a single crystal silicon layer using a conventional selective epitaxial growth method. A silicon substrate 21 being comprised of single crystal silicon is prepared and an oxide layer 22 is formed to expose a portion of the silicon substrate 21 where a single crystal silicon layer is to be formed and then the silicon substrate 21 is inserted into a single crystal silicon growth apparatus (not shown). A single crystal silicon layer 23 is grown on the exposed portion of the silicon substrate 21 by carrying out a selective epitaxial growth process in the single crystal silicon growth apparatus.

However, because the selective epitaxial growth method is carried out at a high temperature of above 1,000° C., it is inapplicable to a semiconductor fabrication process carrying out at a temperature of below 700° C. Furthermore, when the single crystal silicon layer is formed by the selective epitaxial growth method, because silicon nucleation sites are formed over the underlying film of single crystal silicon as well as over the undesired portion such as the oxide layer after the lapse of a predetermined time, a polysilicon layer is also grown over the oxide layer so that the desired process result can not be obtained.

In the prior art, while the single crystal silicon is grown on the exposed portion of the silicon substrate, the thermal energy is provided to the silicon substrate including the oxide layer to prevent the polysilicon from preventing over the oxide layer.

The prior method providing the thermal energy to the silicon substrate including the oxide layer prevents the polysilicon from growing on the oxide layer, in case of growing the single crystal silicon at a thickness of below 400 Å. However, in case of growing the single crystal silicon layer at a thickness of above 400 Å, although the prior method provides the thermal energy to the silicon substrate including the oxide layer, the polysilicon layer is grown over the oxide layer. Accordingly, it is difficult to adapt the prior method for forming the single crystal silicon layers for bit line plug and storage node plug having a thickness of above several thousands Å.

SUMMARY OF THE INVENTION

It is an object of the present invention to provide an apparatus for growing a single crystal silicon having a desired thickness under the process temperature of below 700° C.

It is another object of the present invention to provide a method for forming a single crystal silicon using a single crystal silicon growth apparatus.

According to an aspect of the present invention, there is provided to a single crystal silicon growth apparatus, comprising: a chamber where a silicon substrate is to be inserted; a heat source for rapidly rising a temperature in an interior of the chamber; a cooling line for rapidly dropping a temperature in the interior of the chamber; a gas sprayer for providing a source gas and a purge gas inside the chamber; a gas inflow line connected to the gas sprayer for inflowing the source gas and the purge gas into the gas sprayer; and a gas exhausting line for maintaining the interior of the chamber with a vacuum.

There is also provided to a method for forming a single crystal silicon layer at a selected thickness using a single crystal silicon growth apparatus, comprising the steps of: (a) inserting a silicon substrate where an oxide layer is formed to expose a portion thereof, into a chamber of the single crystal silicon growth apparatus; (b) rapidly raising a temperature of the chamber at 600–700° C.; (c) spraying a source gas into the silicon substrate to form a single crystal silicon layer having a thiner thickness than the selected thickness over an exposed portion of the silicon substrate; (d) puging the chamber to rapidly drop a temperature of the chamber at a room temperature; and (e) forming the single crystal silicon layer to the selected thickness by repeatedly carrying out the steps (b) and (d).

There is further provided to a method for forming a single crystal silicon layer at a selected thickness using a single crystal silicon growth apparatus, comprising the steps of: (a) preparing a silicon substrate where an oxide layer is formed to expose a portion thereof; (b) cleaning the silicon substrate; (c) inserting the silicon substrate into a chamber of the single crystal silicon growth apparatus; (b) rapidly raising a temperature of the chamber at 600–700° C.; (c) spraying a source gas into the silicon substrate to form a single crystal silicon layer having a thinner thickness than the selected thickness over an exposed portion of the silicon substrate; (d) puging the chamber to rapidly drop a temperature of the chamber at a room temperature; and (e) forming the single crystal silicon layer to the selected thickness by repeatedly carrying out the steps (b) and (d).

BRIEF DESCRIPTION OF THE DRAWINGS

The objects and features of the invention may be understood with reference to the following detailed description of an illustrative embodiment of the invention, taken together with the accompanying drawings in which.

DETAILED DESCRIPTION OF THE INVENTION

A method for forming a single crystal silicon layer of the present invention is carried out under the temperature of 600–700° C. applicable to the conventional semiconductor process with the same principle as the conventional selective growth method.

The method for forming a single crystal silicon layer includes the following three stage processes: The first stage is to grow a single crystal silicon having a thinner thickness than the desired one only over an exposed portion of the silicon substrate which an oxide layer is formed in by providing the thermal energy to the silicon substrate during the time of a certain degree that the silicon nucleation site is not grown over the oxide layer. The second stage process is to rapidly cool the temperature of the silicon substrate to a room temperature by compulsion to remove the thermal energy provided to the substrate. The third stage process is to repeatedly carry out the first and second stage processes to form the single crystal silicon layer having the desired thickness.

So as to embody the method for forming the single silicon layer, the present invention provides a single crystal silicon growth apparatus being capable of minimizing the time required in rise and drop of the temperature inside the chamber where the substrate silicon is to be inserted.

Figure 1:
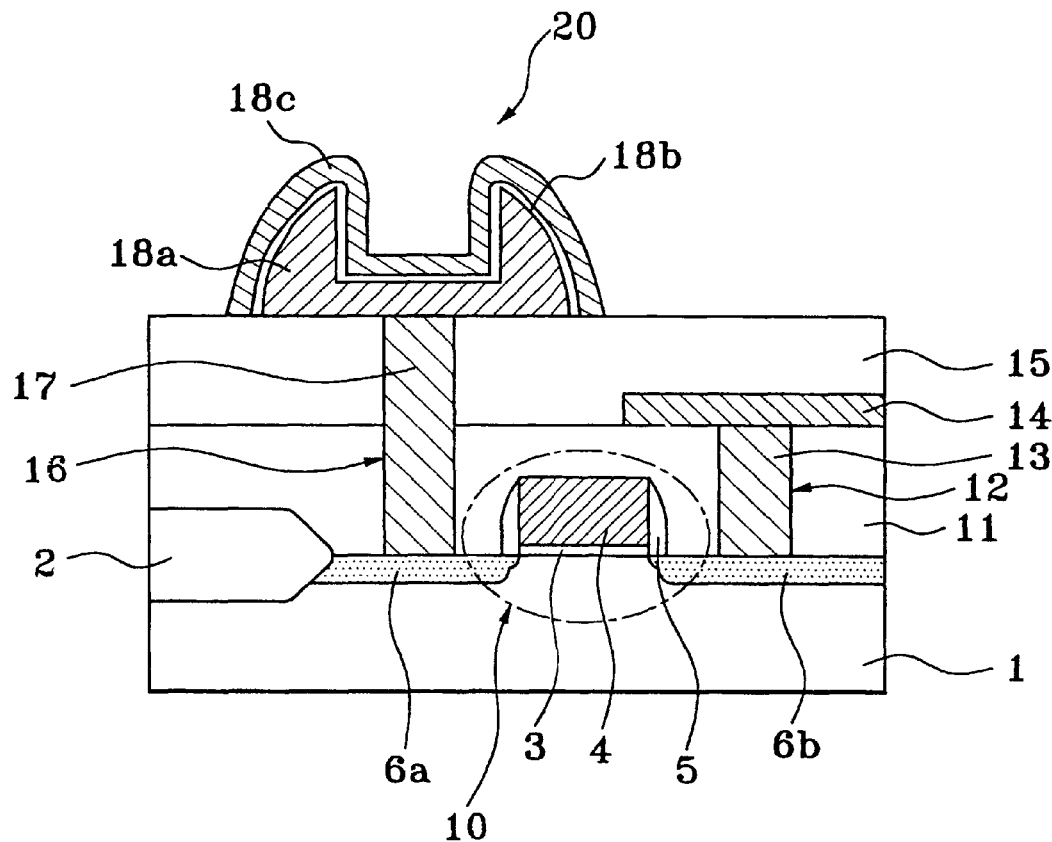
FIG. 1 is a sectional view of a typical DRAM cell.
Figure 2:
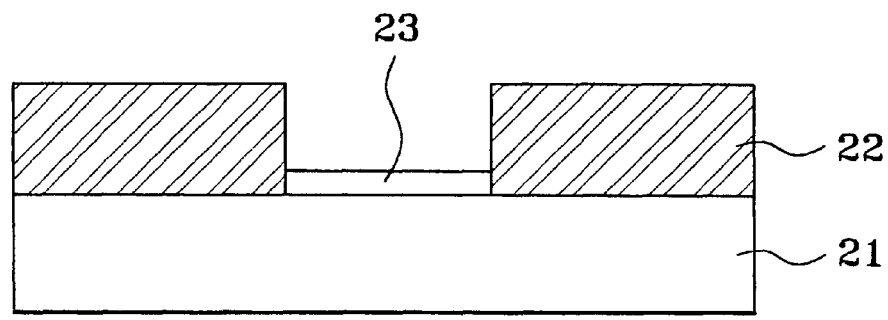
FIG. 2 is a sectional view illustrating a method for forming a single crystal silicon layer using a conventional selective epitaxial growth method.
Figure 3:
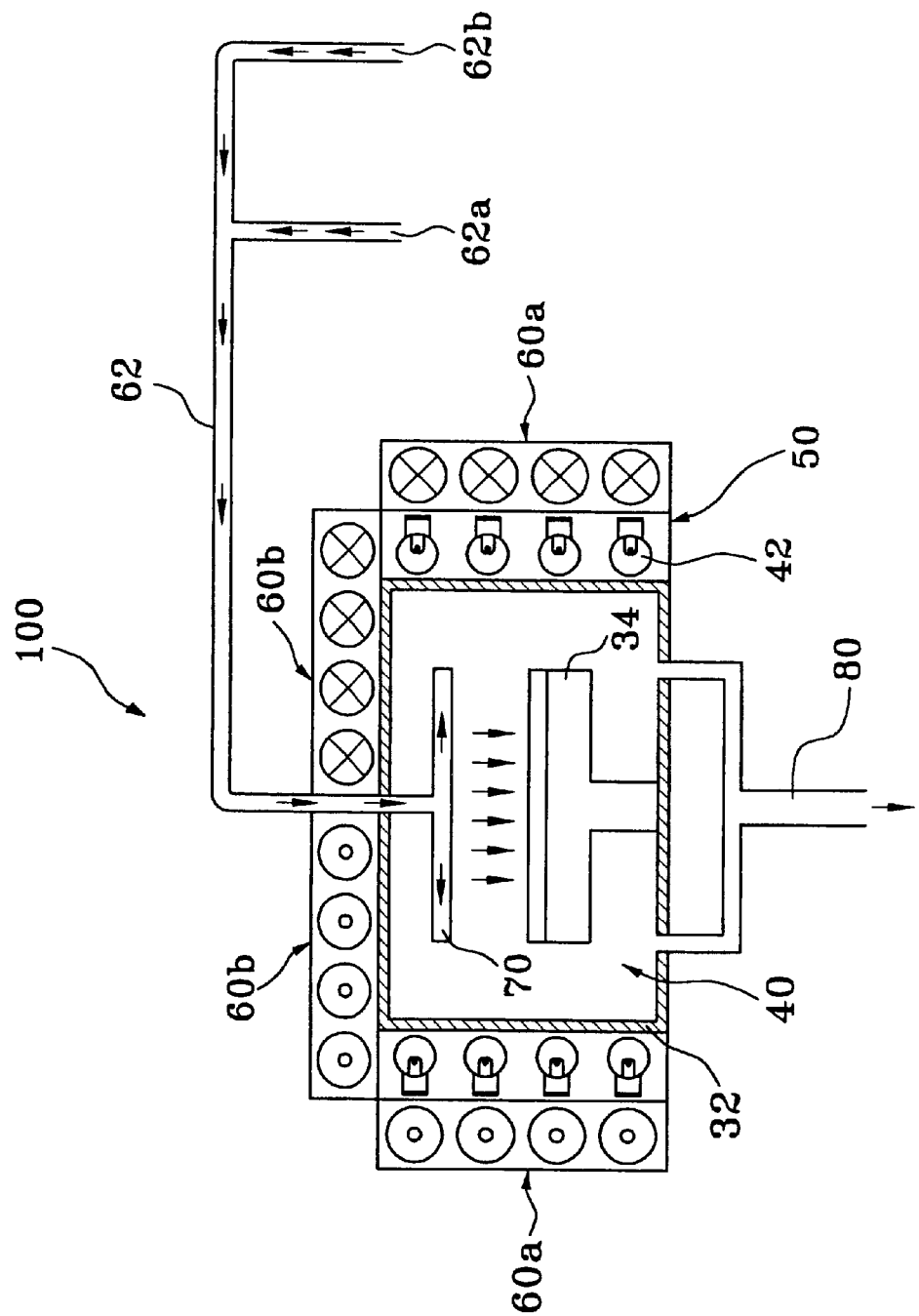
FIG. 3 is a sectional view illustrating an apparatus for growing a single crystal silicon in accordance with an embodiment of the present invention.

FIG. 3 is a sectional view illustrating an apparatus for growing a single crystal silicon in accordance with an embodiment of the present invention. The single crystal silicon growth apparatus 100 includes a chamber 40 where a silicon substrate 90 is to be inserted, a heat source 50 for rapidly rising the temperature inside the chamber 40, cooling means 60a and 60b for rapidly dropping the temperature in the interior of the chamber 40, a gas sprayer 70 for providing a source gas and a purge gas inside the chamber 40, a gas inflow line connected to the gas sprayer 70 for flowing the source gas and the purge gas into the gas sprayer 70 and a gas exhausting line 80 for maintaining the interior of the chamber 40 with a vacuum.

The heat source 50 is disposed in a sidewall of an outside of the chamber 40 and as the heat source 50, a plurality of halogen lamps 42 are used, which are suitable to fast ramp up the interior temperature of the chamber 40. The inside wall of chamber 40 is made of quartz which has an excellent transmittance and a high heat-resistant and sufficiently radiates the light from the halogen lamp 42 to the silicon substrate 90. A stage 34 which the silicon substrate 90 is laid on, is disposed in the bottom of the chamber 40.

Figure 4:
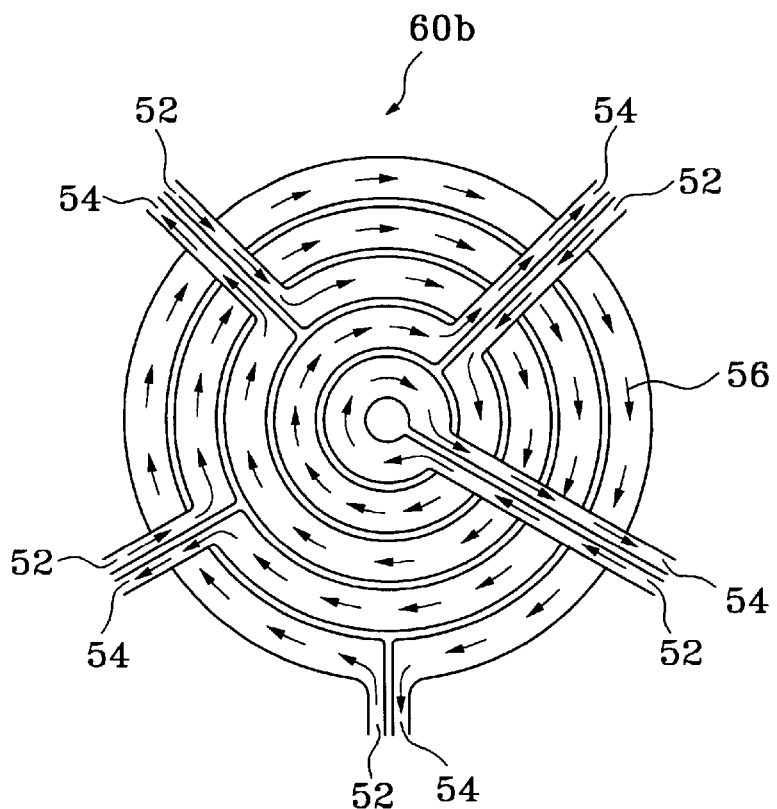
FIG. 4 is a plan view illustrating a cooling line of the single crystal growth apparatus in FIG. 3.

The cooling means includes first cooling lines 60a being disposed in the outer surface of the heating source 50 and second cooling lines 60b being supposed in the outer surface of the upper portion of the chamber 40. The interior temperature of the chamber 40 is rapidly dropped at the room temperature by inflowing the cool water into the first and second cooling lines 60a and 60b. FIG. 4 is a plan view of the second cooling lines 60b disposed in the upper outer surface of the chamber 40. The second cooling lines 60b are disposed in concentric circle type and the cooling wafer is supplied with each cooling line. The reference number 52 designates an inlet of the cooling water, 54 an outlet of the cooling wafer and 56 flow of the cooling wafer, respectively. Although not shown in drawing, the first cooling lines 60a are ring types and are disposed in the outer sidewall of the chamber 40 with a stack type.

Figure 5:
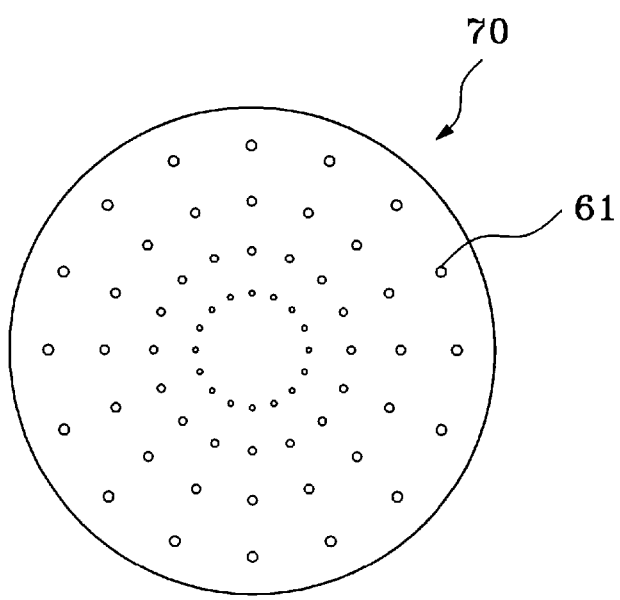
FIG. 5 is a plan view illustrating a gas sprayer of the single crystal growth apparatus in FIG. 3.

FIG. 5 is a plan view of the gas sprayer. The gas sprayer 70 includes a plurality of holes 61 for spraying gases which are arranged with a radial type. So as to uniformly spray gases, the holes 61 becomes large in size from the central portion to the peripheral portion. The gas inflow line 62 is connected to the gas sprayer 70 and inflows a source gas such as $SiH_4$ or $Si_2H_6$ and a purge gas such as Ar into the spray 70. An inlet 62a for inflowing the source gas and an inlet 62b for inflowing the purge gas are connected to the gas inflow line 62. The gas exhausting line 80 is disposed the lower end of the chamber 40. The gas exhausting line 80 maintains the interior of the chamber 40 with a vacuum of above $10^{-7}$ torr.

Figure 6A:
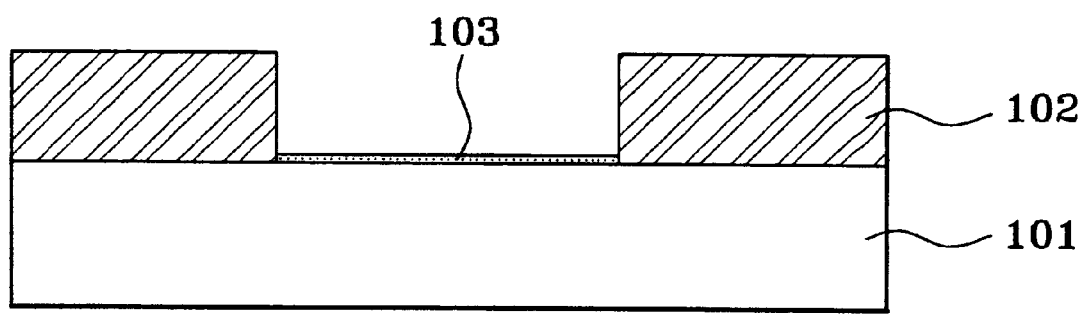
FIG. 6A to FIG. 6D are sectional views illustrating a method for forming a single crystal silicon layer in accordance with another embodiment of the present invention.

FIG. 6A to FIG. 6D are sectional views illustrating a method for forming a single crystal silicon layer using the single crystal growth apparatus of the present invention. Referring to FIG. 6A, a single crystal silicon substrate 101 is prepared and an oxide layer 102 is formed on the substrate 101 to expose a portion of the silicon substrate 101. At this time, over the exposed portion of the silicon substrate, a native oxide layer 103 is formed and particles (not shown) are adsorbed.

Figure 6B:
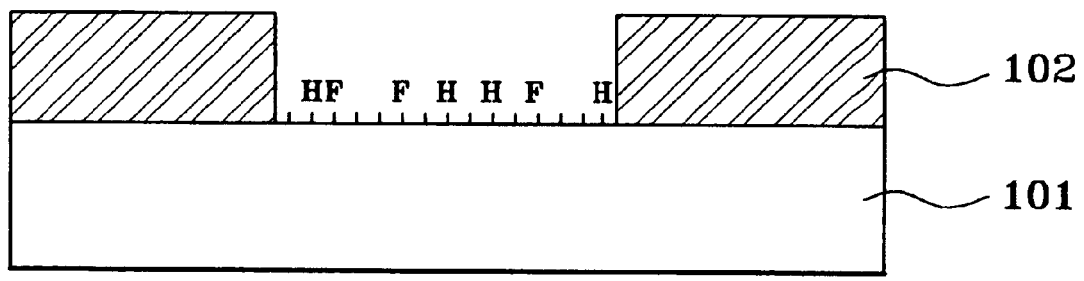

Referring to FIG. 6B, a cleaning process is carried out so as to remove the native oxide and particles in the surface of the substrate. The cleaning process includes a first cleaning step using any one of a first solution which is comprised of $H_2SO_4$, $H_2O_2$ and $H_2O$ or a second solution which is comprised of $NH_4OH$, $H_2O_2$ and $H_2O$ and a second cleaning step using an etchant for an oxide layer such as HF. As a result of the cleaning process, the surface of the substrate becomes a dangling bonding state and a portion of the surface of the silicon substrate 101 is bonded with H radicals and F radicals.

Figure 6C:
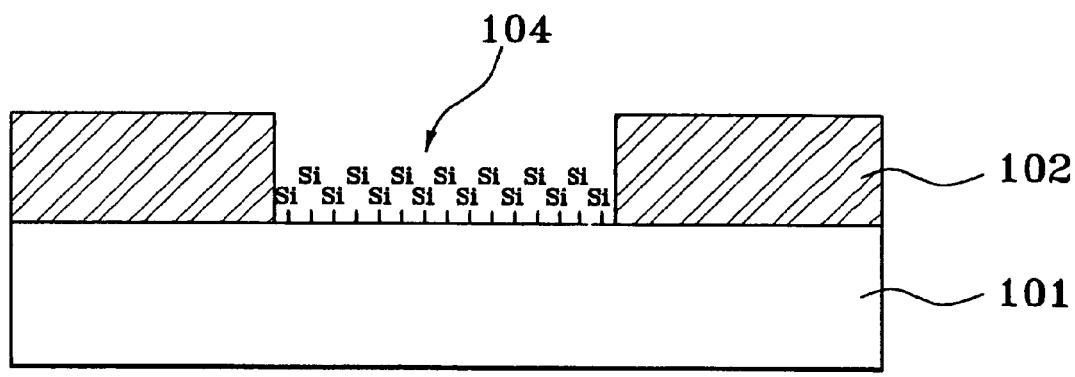

Referring to FIG. 6C, the cleaned silicon substrate 101 is inserted in the chamber of the single crystal silicon growth apparatus of the present invention in FIG. 3. The interior of the chamber is maintained with a high vacuum state of above $10^{-7}$ torr. At this time, the insertion of the substrate 101 to the chamber is accomplished without time break so as to prevent particles from adsorbing in the surface of the silicon substrate 101 again.

Then, the interior temperature of the chamber where the silicon substrate 101 is inserted rapidly rises at 600–700° C. by turning on the halogen lamps 42 of the heating source 50, for example with the temperature rising speed of 10 deg. C. At this time, H radicals or F radicals boned to the surface of the silicon substrate 101 are detached so that the entire surface of the silicon substrate 101 becomes a dangling bonding state again.

Subsequently, if the temperature of the chamber is stabilized, the source gas $SiH_4$ or $Si_2H_6$ is sprayed through the gas sprayer 70 to the silicon substrate 101 including the oxide layer 102, so that a single crystal silicon layer 104 is grown over the exposed surface of the silicon substrate 101. The growth time of the single crystal silicon layer 104 must not exceed the critical time where a silicon seed is adsorbed to the surface of the oxide layer 102. Therefore, the grown single crystal silicon layer 104 does not has a desired thickness.

Then, the halogen lamps are turned off and the spray of the source gas is stopped. Simultaneously, the purge gas such as Ar is sprayed from the gas sprayer 70 into the chamber through the purge gas inflow inlet connected to the gas inflow line and the cooling water is flowed to the cooling lines to compulsorily drop the temperature of the chamber to a room temperature, for example with the temperature drop speed of 10 deg. C. At this time, the chamber is maintained with a vacuum state.

Figure 6D:
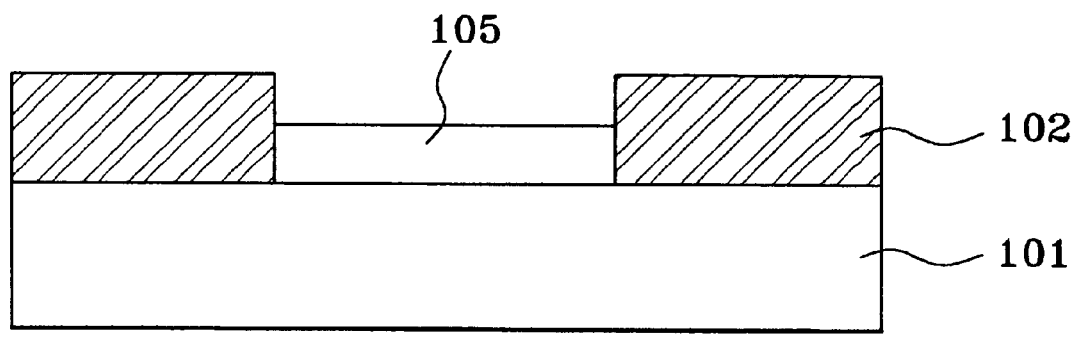

Referring to FIG. 6D, the single crystal silicon layer 105 having a desired thickness is formed by repeatedly carrying out the process of FIG. 6C, for example, heating, spraying of the source gas and cooling processes. According to the present invention, the single crystal silicon layer 105 having a desired thickness can be formed only on the underlying layer being comprised of a single crystal silicon layer except the oxide layer. Furthermore, the single crystal silicon layer can be formed at a temperature of 600–700° C. so that the single crystal silicon layer formation process is applicable to the conventional semiconductor fabrication process. Accordingly, by the single crystal silicon layer formation process, it can form the single crystal silicon layer having a several thousands Å over the underlying layer of a silicon layer so that it can replace the polysilicon layer by the single crystal silicon layer for the bit line plug or the storage node plug, thereby improving the data input/output speed of the DRAM devices.

Hereinafter, the application example of the method for forming a single crystal silicon layer of the present invention will be described in more detail.

EXAMPLE I

Figure 7A:
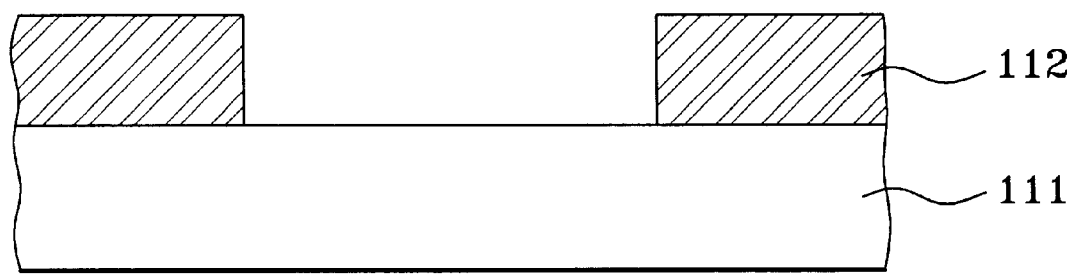
FIG. 7A and FIG. 7B are sectional views illustrating a method forming an isolation film using the single crystal silicon formation method in accordance with another embodiment of the present invention.
Figure 7B:
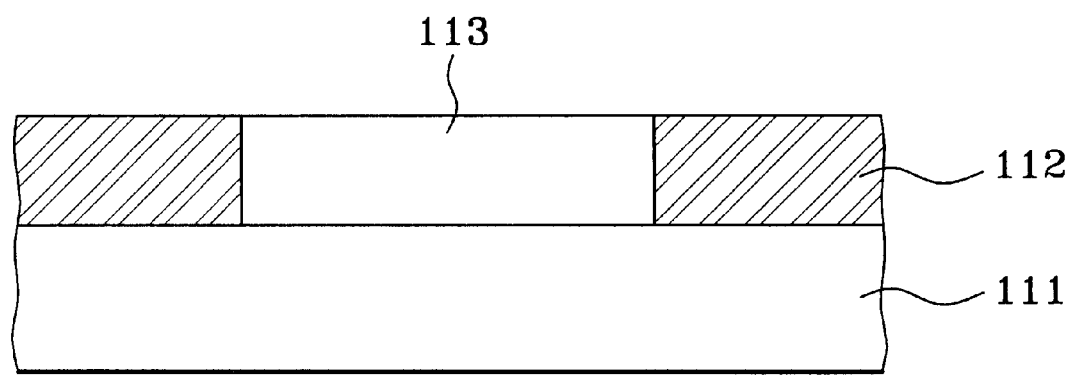

FIG. 7A and FIG. 7B are sectional views illustrating a method for forming an isolation film using the single crystal silicon grown method of the present invention. Referring to FIG. 7A, a silicon substrate 111 being comprised of single crystal silicon, is prepared. An oxide layer 112 having a thickness which is equal to the desired thickness of an isolation layer to be formed in the following process, is deposited over the silicon substrate 111 and then etched so as to expose the portion of the silicon substrate 111 where a single crystal silicon layer is to be formed in the following process.

Referring to FIG. 7B, a single crystal silicon layer 113 is formed over the exposed portion of the silicon substrate 111 at the same thickness as the oxide layer 112 by the above single crystal silicon formation process of the present invention. As a result, the grown single crystal silicon layer 113 serves as a device formation region and the oxide layer 113 serves as the isolation layer.

The conventional LOCOS inevitably causes the bird's beak in the isolation layer to reduce the device formation region. However, the present invention does not occur the bird's beak in the isolation layer to assure the desired dimension of the device formation region and the device formation regions is not affected during the formation of the isolation layer to improve the characteristic of the transistor which is to be formed in the device formation region.

EXAMPLE II

Figure 8A:
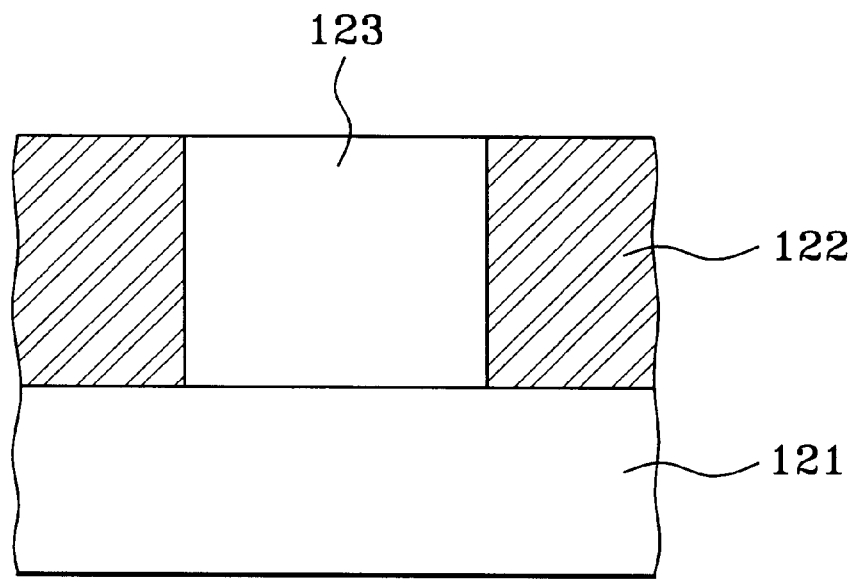
FIG. 8A and FIG. 8B are sectional views illustrating a method forming a three-dimensional single silicon substrate using the single crystal silicon formation method in accordance with still another embodiment of the present invention.
Figure 8B:
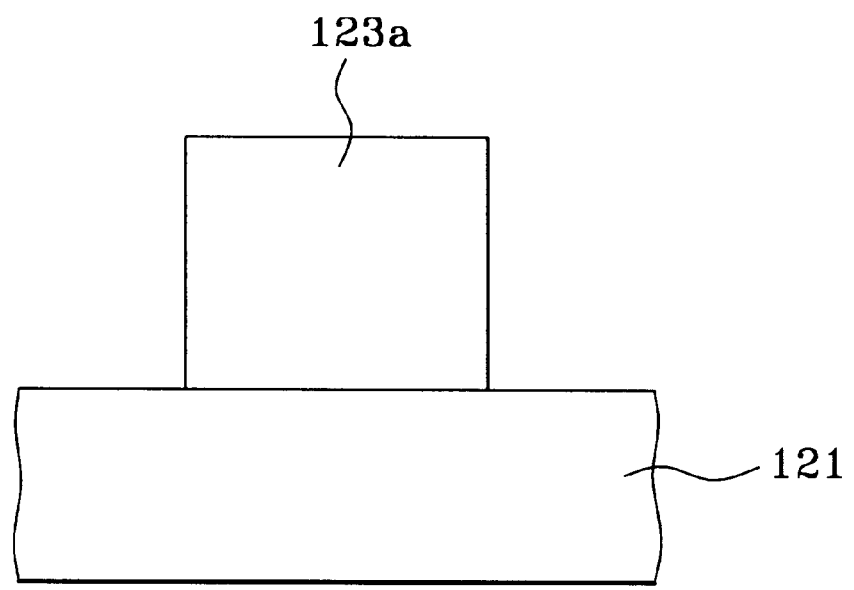

FIG. 8A and FIG. 8B are sectional views illustrating a method for forming a three-dimensional single crystal silicon substrate using the single crystal silicon grown method of the present invention. Referring to FIG. 8A, a silicon substrate 121 being comprised of single crystal silicon, is prepared. An oxide layer 122 is formed over the silicon substrate 121 so as to expose the portion of the silicon substrate 121. A single crystal silicon layer 123 is formed over the exposed portion of the silicon substrate 121 at the same thickness as the oxide layer 122 by the single crystal silicon growth method of the present invention.

Referring to FIG. 8B, the oxide layer 122 is removed to form a three-dimensional single crystal silicon-substrate 123a over the silicon substrate 121. Herein, If the three-dimensional single crystal silicon substrate 123a is formed over the silicon substrate 121, the surface dimension of the substrate where a transistor is to be formed, is increased to accomplish the high integration of the semiconductor device.

EXAMPLE III

Figure 9A:
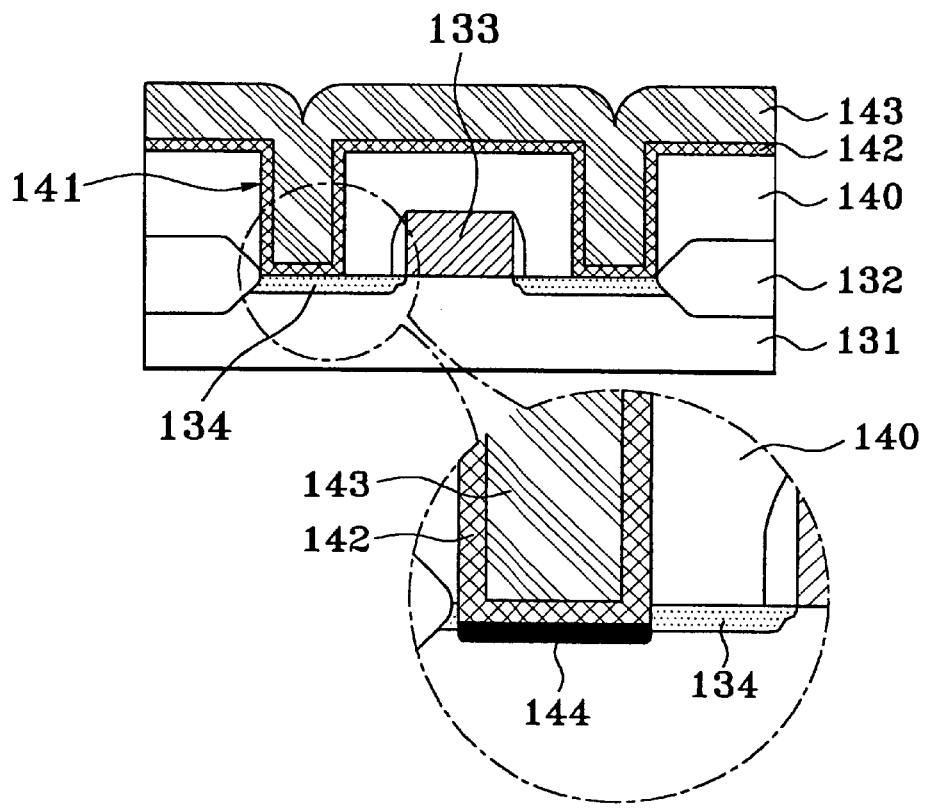
FIG. 9A and FIG. 9B are sectional views illustrating a method forming a metal contact hole using the single crystal silicon formation method in accordance with further another embodiment of the present invention.
Figure 9B:
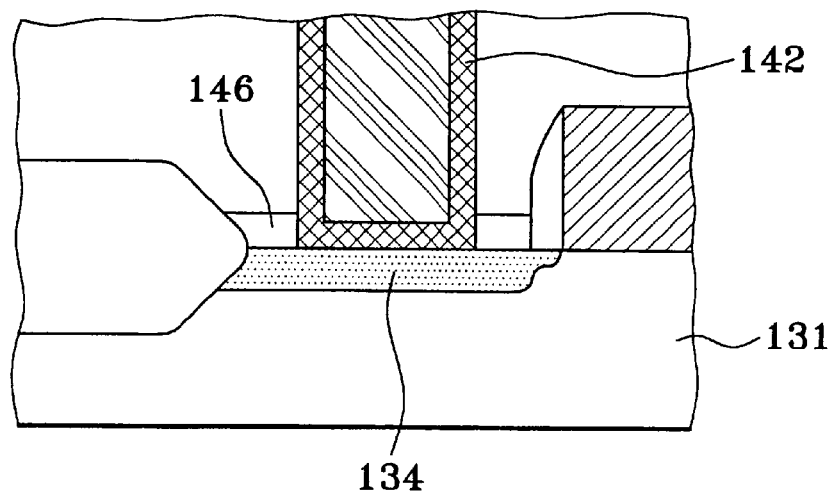

FIG. 9A and FIG. 9B are sectional views illustrating a method for forming a metal contact hole using a single crystal silicon substrate using the single crystal silicon grown method of the present invention. Referring to FIG. 9A, a metal contact hole 141 is formed to expose source and drain regions 134 by etching an intermediate insulating layer 140. A barrier metal 142 such as Ti/TiN is formed over the intermediate insulating layer 140 including the metal contact hole 141. A metal film 143 is deposited over the barrier metal 142 to be buried with the metal contact hole 141.

However, in etching the intermediate insulating layer 140 to form the metal contact hole 141, the portions of the source and drain regions 134 are removed. At this time, if the barrier metal is formed, Ti of the barrier metal 142 and Si of the silicon substrate 131 are reacted to form a titanium silicide 144 which is contacted with the silicon substrate 131 through the source and drain region 134, thereby increasing the leakage current.

So as to solve the problem, as shown in FIG. 9B, a single crystal silicon layer 146 having a thickness of 500–1,000 Å is formed over the source and drain regions 134 by using the single crystal silicon formation process of the present invention. When the metal contact 141 is formed, the single crystal silicon layer 146 serves as an etching buffer to prevent the portions of the source and drain regions from removing, thereby restraining the leakage current.

As above described, According to the present invention, the single crystal silicon growth method can form a single crystal silicon layer having a desired thickness at a temperature of 600–700° C. and it can replace the polysilicon layer by the single crystal silicon layer for the bit line plug or the storage node plug, thereby improving the data input/output speed of the DRAM devices.

Besides, the present invention is applicable to form an isolation layer, 3-dimensional single crystal silicon substrate and a metal contact hole and it can prevent the device formation region from reducing and damaging due to the isolation formation, thereby accomplishing high integration and improving the characteristic and reliability of the devices.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A single crystal silicon growth apparatus, comprising:
   a chamber where a silicon substrate is to be inserted;
   a heat source for raising the temperature in an interior of the chamber;
   a cooling line for rapidly dropping the temperature in the interior of the chamber, the cooling line being disposed in an upper outer surface of the chamber and an outer surface of the heat source;
   a gas sprayer for providing a source gas and a purge gas inside the chamber;
   a gas inflow line connected to the gas sprayer for inflowing the source gas and the purge gas into the gas sprayer; and
   a gas exhausting line for maintaining a vacuum within the interior of the chamber.

2. The apparatus as claimed in claim 1, wherein the inside wall is comprised of quartz.

3. The apparatus as claimed in claim 1, wherein the heating source is halogen lamps.

4. The apparatus as claimed in claim 1, wherein the sprayer includes a plurality of holes for spraying the gas and the holes are disposed in a radical type.

5. The apparatus as claimed in claim 4, wherein the diameters of holes become large from the central portion of the sprayer to the peripheral portion.

6. The apparatus as claimed in claim 1, further comprising a source gas inflow inlet and a purge gas inflow inlet connected to the gas inflow line.

7. A method for forming a single crystal silicon layer at a selected thickness using a single crystal silicon growth apparatus, comprising the steps of:
   (a) inserting a silicon substrate where an oxide layer is formed to expose a portion thereof, into a chamber of the single crystal silicon growth apparatus;
   (b) rapidly raising a temperature of the chamber at 600–700° C.;
   (c) spraying a source gas into the silicon substrate to form a single crystal silicon layer having a thinner thickness than the selected thickness over an exposed portion of the silicon substrate;
   (d) purging the chamber to rapidly drop a temperature of the chamber at a room temperature; and
   (e) forming the single crystal silicon layer to the selected thickness by repeatedly carrying out the steps (b) and (d).

8. The method as claimed in claim 7, further comprising the step of cleaning the substrate before the substrate where the oxide layer is formed is inserted into the chamber.

9. The method as claimed in claim 8, wherein the cleaning step includes a first cleaning step using any one of a first solution which is comprised of $H_2SO_4$, $H_2O_2$ and $H_2O$ or a second solution which is comprised of $NH_4OH$, $H_2O_2$ and $H_2O$ and a second cleaning step using an etchant for an oxide layer such as HF.

10. The method as claimed in claim 7, wherein the temperature rising rate of the chamber is 10 deg. C. per minute.

11. The method as claimed in claim 7, wherein the source gas is selected from any one of $SiH_4$ or $Si_2H_6$.

12. The method as claimed in claim 7, wherein the temperature drop rate of the chamber is 10 deg. C. per minute.

13. The method as claimed in claim 7, wherein the purge step of the is carried out by flowing Ar gas into inside chamber.

14. The method as claimed in claim 7, wherein the steps (d) and (e) are carried out within the chamber being a vacuum state.

15. The method as claimed in claim 8, wherein the chamber is maintained with a vacuum of above $10^{-7}$ torr.

16. A method for forming a single crystal silicon layer at a selected thickness using a single crystal silicon growth apparatus, comprising the steps of:
   (a) preparing a silicon substrate where an oxide layer is formed to expose a portion thereof;
   (b) cleaning the silicon substrate;
   (c) inserting the silicon substrate into a chamber of the single crystal silicon-growth apparatus;
   (d) raising a temperature of the chamber at 600–700° C., spraying a source gas into the silicon substrate to form a single crystal silicon layer over an exposed portion of the silicon substrate;
   (e) cooling the chamber at a room temperature;
   (f) purging the chamber; and
   (g) forming the single crystal silicon layer to a desired thickness by repeatedly carrying out the steps (d) and (e).

17. The method as claimed in claim 16, wherein the cleaning step includes a first cleaning step using any one of a first solution which is comprised of $H_2SO_4$, $H_2O_2$ and $H_2O$ or a second solution which is comprised of $NH_4OH$, $H_2O_2$ and $H_2O$ and a second cleaning step using an etchant for an oxide layer such as HF.

18. The method as claimed in claim 16, wherein the steps (d) and (e) are carried out with a vacuum state.

19. The method as claimed in claim 18, wherein the temperature drop rate and the temperature rising speed of the chamber are 10 deg. C. per minute.

* * * * *

UNITED STATES PATENT AND TRADEMARK OFFICE
CERTIFICATE OF CORRECTION

PATENT NO. : 6,368,405 B1 Page 1 of 1
DATED : April 9, 2002
INVENTOR(S) : Seung Woo Shin It is certified that error appears in the above-identified patent and that said Letters Patent is hereby corrected as shown below:

Column 8,
Line 60, "the is" should read -- the chamber is --.

Column 9,
Line 8, "silicon-growth" should read -- silicon growth --.

Column 10,
Line 12, "claim 18" should read -- claim 16 --.

Signed and Sealed this

Seventeenth Day of December, 2002

JAMES E. ROGAN
*Director of the United States Patent and Trademark Office*